United States Patent
Kusaba et al.

(10) Patent No.: US 7,927,957 B2
(45) Date of Patent: Apr. 19, 2011

(54) METHOD FOR PRODUCING BONDED SILICON WAFER

(75) Inventors: Tatsumi Kusaba, Tokyo (JP); Akihiko Endo, Tokyo (JP); Hideki Nishihata, Tokyo (JP); Nobuyuki Morimoto, Tokyo (JP)

(73) Assignee: SUMCO Corporation, Minato-ku (JP)

( * ) Notice: Subject to any disclaimer, the term of this patent is extended or adjusted under 35 U.S.C. 154(b) by 20 days.

(21) Appl. No.: 12/557,809

(22) Filed: Sep. 11, 2009

(65) Prior Publication Data

US 2010/0068867 A1  Mar. 18, 2010

(30) Foreign Application Priority Data

Sep. 12, 2008  (JP) ................. 2008-235294

(51) Int. Cl.
*H01L 21/331* (2006.01)
*H01L 21/8222* (2006.01)

(52) U.S. Cl. ... 438/311; 438/510; 438/513; 257/E21.32; 257/E21.077; 257/E21.278; 257/E21.304; 257/E21.311; 257/E21.316

(58) Field of Classification Search .................. 438/311, 438/508, 509, 510, 513, 732, 743, 753; 257/E21.32, 257/77, 278, 304, 311, 316

See application file for complete search history.

(56) References Cited

U.S. PATENT DOCUMENTS

| 7,399,681 | B2 * | 7/2008 | Couillard et al. | 438/458 |
| 2004/0229444 | A1 * | 11/2004 | Couillard et al. | 438/455 |

FOREIGN PATENT DOCUMENTS

| JP | 09-116125 A | 5/1997 |
| JP | 2000-124092 A | 4/2000 |
| WO | 2005074033 A1 | 8/2005 |

* cited by examiner

*Primary Examiner* — David Nhu
(74) *Attorney, Agent, or Firm* — Christensen O'Connor Johnson Kindness PLLC

(57) ABSTRACT

A bonded silicon wafer is produced by a method including an oxygen ion implantation step on a silicon wafer for active layer having the specified wafer face; a step of bonding the silicon wafer for active layer to a silicon wafer for support; a first heat treatment step; an inner $SiO_2$ layer exposing step; a step of removing the inner $SiO_2$ layer; and a planarizing step of polishing a silicon wafer composite or subjecting the silicon wafer composite to a heat treatment in a reducing atmosphere (a second heat treatment step).

8 Claims, No Drawings

METHOD FOR PRODUCING BONDED SILICON WAFER

BACKGROUND OF THE INVENTION

1. Field of the Invention

This invention relates to the production of a bonded silicon wafer, and more particularly to a method for producing a bonded silicon wafer through steps of an oxygen ion implantation-etching/polishing stop wherein an $SiO_2/Si$ interface roughness can be improved by using a silicon wafer for active layer with such a wafer face that an inclination angle θ (compound angle) with respect to a face perpendicular to <100> orientation or <110> orientation of a silicon single crystal ingot is $0°<θ≦0.15°$. Moreover, the production method according to the invention is applicable to both of an SOI (Silicon On Insulator) wafer and a DSB (Direct Silicon Bonding) wafer, and can prevent a blue haze in case of the DSB wafer.

2. Description of the Related Art

The SOI wafer has superiority in separation between devices, reduction of parasitic capacity between a device and a substrate and capability of a three-dimensional structure as compared with the conventional silicon wafer. Therefore, it is used in high-speed and low power consumption LSI. As a method of producing the SOI wafer, there is known a bonding method wherein two silicon wafers provided with an oxide film are bonded to each other and thereafter grinding and polishing are conducted to form an SOI layer (active layer). In the bonding method is included a Smart Cut (registered trademark) method (see JP-A-H09-116125 and JP-A-2000-124092).

In the SOI wafer are required thinning and thickness uniformization of the SOI layer (active layer). Therefore, a new way has been developed. This way allows the thinning and thickness uniformization of the SOI layer (active layer) by bonding a silicon wafer for active layer having an oxygen ion implanted layer to a silicon wafer for support layer, subjecting to a heat treatment to convert the oxygen ion implanted layer into an $SiO_2$ layer, grinding and polishing from a side of the silicon wafer for active layer to the $SiO_2$ layer, and thereafter removing the $SiO_2$ layer (see WO 2005/074033). The oxygen ion implanted layer serves as an etching/polishing stop layer.

Recently, the thickness of an oxide film as a BOX layer is thinned with the miniaturization and low power consumption of devices, and further the development of DSB wafer by directly bonding without the BOX layer (oxide film) is also conducted. When the wafers are directly bonded without an oxide film, the usual cleaning (SC1) is carried out before the bonding of silicon wafer for active layer and silicon wafer for support.

However, in the method of producing a bonded silicon wafer by using an etching/polishing stop layer described in WO 2005/074033, there are the following problems.

(1) The interface roughness between a layer containing $SiO_2$ particles as a polishing stop layer or a continuous $SiO_2$ layers and a silicon substrate is large, and hence the surface roughness of a bonded wafer as a final product becomes large.

(2) For this end, after the formation of an SOI structure, it is required to conduct polishing of not less than 0.1 μm or a high-temperature heat treatment above 1200° C. for more than 1 hour as an additional process for improving the surface roughness. The polishing of not less than 0.1 μm leads to deteriorate the thickness uniformity of the SOI layer as a final product. On the other hand, the high-temperature heat treatment leads to cause the quality loss such as slipping or the like, and the increase in cost.

As to (1), there is caused a similar problem in the bonding method using the etching/polishing stop layer for not only SOI wafer but also DSB wafer.

Furthermore, the DSB wafer has a problem of a blue haze that the wafer surface appears blue. In the SOI wafer, a color is observed depending on the thickness of SOI by optical interference with a buried oxide film, but if the blue haze is generated, a different color may be observed due to the overlap of the interference light with the blue haze, which is regarded as a defect. In any case, it is desired to solve these problems.

SUMMARY OF THE INVENTION

It is, therefore, an object of the invention to solve the above problems and to provide a method for producing a bonded silicon wafer wherein the interface roughness between $SiO_2$ layer as an etching/polishing stop layer and a silicon wafer is controlled in the bonding method using an etching/polishing stop layer to make a surface roughness of an active layer small. Although the bonded silicon wafer includes both an SOI wafer and a DSB wafer, if the bonded silicon wafer is the DSB wafer, it is to provide a production method for a silicon wafer being free from a blue haze.

As conventional knowledge, it is known that since oxygen ions in the ion implantation react with surrounding silicon to form an $SiO_2$ layer serving as a stop layer at subsequent steps, if $SiO_2$ reaction is promoted, an interface roughness of $SiO_2/Si$ is improved. In order to promote the reaction, it has hitherto been required to keep the wafer at an ultrahigh temperature of not lower than 1300° C. for a prolonged time. However, it is found out that even if the ultrahigh-temperature heat treatment is conducted after bonding, the $SiO_2$ reaction is not promoted and the roughness is not improved as compared with the case of conducting the ultrahigh-temperature heat treatment at a state of not bonding the wafers.

The inventors have made further studies and found that the surface roughness is improved and crystal defects in the active layer are reduced when a silicon wafer with a substrate oxygen concentration of $10×10^{17}/cm^3$ to $18×10^{17}/cm^3$ (old ASTM conversion) sliced so as to have such a wafer face that an inclination angle θ (compound angle) with respect to a face perpendicular to a crystal orientation of a silicon single crystal ingot is $0°<θ≦0.15°$ is used as a silicon wafer for active layer. Furthermore, it is also found that the blue haze is not caused in the DSB wafer unless θ is 0°. Moreover, the value of the substrate oxygen concentration in the following explanation is an old ASTM conversion unless otherwise specified.

The invention is made on the basis of the above knowledge, and the summary and construction thereof are as follows:

1. A method for producing a bonded silicon wafer comprising a step of implanting oxygen ions from one-side face of a silicon wafer for active layer with a substrate oxygen concentration of $10×10^{17}/cm^3$ to $18×10^{17}/cm^3$ (old ASTM conversion) sliced so as to have such a wafer face that an inclination angle θ (compound angle) with respect to a face perpendicular to <100> orientation or <110> orientation of a silicon single crystal ingot is $0°<θ≦0.15°$ to form an oxygen ion implanted layer at a given depth position from the one-side face of the silicon wafer for active layer;

a step of bonding the one-side face of the silicon wafer for active layer to one-side face of a silicon wafer for support to form a silicon wafer composite;

a first heat treatment step of heat-treating the silicon wafer composite to strengthen the bonding and to convert the oxygen ion implanted layer into an inner $SiO_2$ layer;

a step of exposing the inner $SiO_2$ layer from other face of the silicon wafer for active layer in the silicon wafer composite;

a step of removing the inner $SiO_2$ layer; and a planarizing step of polishing a surface of the silicon wafer composite after the removal of the inner $SiO_2$ layer or subjecting the silicon wafer composite to a heat treatment in a reducing atmosphere (a second heat treatment step) to improve a flatness of the silicon wafer composite.

2. A method for producing a bonded silicon wafer according to the item 1, wherein the silicon wafer for active layer is a p-type silicon wafer.

3. A method for producing a bonded silicon wafer according to the item 2, wherein the p-type silicon wafer contains boron as an electrically conductive component.

4. A method for producing a bonded silicon wafer according to the item 1, wherein the given depth position of the oxygen ion implantation is a depth position of 300 to 600 nm from the one-side face of the silicon wafer for active layer.

5. A method for producing a bonded silicon wafer according to the item 1, wherein the silicon wafer composite is formed by indirectly bonding the one-side face of the silicon wafer for active layer to the silicon wafer for support through an insulating layer previously formed on the one-side face of the silicon wafer for support.

6. A method for producing a bonded silicon wafer according to the item 1, wherein the silicon wafer composite is formed by directly bonding the one-side face of the silicon wafer for active layer to the silicon wafer for support without an insulating layer.

7. A method for producing a bonded silicon wafer according to the item 1, wherein the first heat treatment step is conducted within a temperature region of 1000 to 1300° C.

8. A method for producing a bonded silicon wafer according to the item 1, wherein the second heat treatment step is conducted within a temperature region of 1000 to 1200° C.

According to the invention, it is possible to produce a bonded silicon wafer (e.g. SOI wafer and DSB wafer) in which the surface roughness of an active layer is small. According to the invention, it is also possible to produce a DSB wafer without a blue haze.

DESCRIPTION OF THE PREFERRED EMBODIMENTS

The invention will be concretely described below. The production method according to the invention comprises the following steps:

(1) a step of implanting oxygen ions from one-side face of a silicon wafer for active layer with a substrate oxygen concentration of $10 \times 10^{17}/cm^3$ to $18 \times 10^{17}/cm^3$ (old ASTM conversion) sliced so as to have such a wafer face that an inclination angle $\theta$ (compound angle) with respect to a face perpendicular to a crystal orientation of a silicon single crystal ingot is $0°<\theta \leq 0.15°$ to form an oxygen ion implanted layer at a given depth position from the one-side face of the silicon wafer for active layer;

(2) a step of bonding the one-side face of the silicon wafer for active layer to one-side face of a silicon wafer for support to form a silicon wafer composite;

(3) a first heat treatment step of heat-treating the silicon wafer composite to strengthen the bonding and to convert the oxygen ion implanted layer into an inner $SiO_2$ layer;

(4) a step of exposing the inner $SiO_2$ layer from other face of the silicon wafer for active layer in the silicon wafer composite;

(5) a step of removing the inner $SiO_2$ layer; and (6) a planarizing step of polishing a surface of the silicon wafer composite after the removal of the inner $SiO_2$ layer or subjecting the silicon wafer composite to a heat treatment in a reducing atmosphere (a second heat treatment step) to improve a flatness of the silicon wafer composite.

Next, each of the above steps will be described.

(1) Step of Forming Oxygen Ion Implanted Layer

As a silicon wafer for active layer is used a silicon wafer having a substrate oxygen concentration of $10 \times 10^{17}/cm^3$ to $18 \times 10^{17}/cm^3$. The silicon wafer having a substrate oxygen concentration of $10 \times 10^{17}/cm^3$ to $18 \times 10^{17}/cm^3$ may be a p-type wafer, more concretely a wafer containing a boron as an electrically conductive component. Since it is difficult to conduct the crystal pulling in a wafer having a substrate oxygen concentration of less than $10 \times 10^{17}/cm^3$, the invention uses a wafer having a substrate oxygen concentration of not less than $10 \times 10^{17}/cm^3$. On the other hand, when the substrate oxygen concentration exceeds $18 \times 10^{17}/cm^3$, oxygen precipitates ($SiO_2$) are formed in an active layer at the first heat treatment step, and $SiO_2$ is etched at the subsequent polishing or heat treatment in a reducing atmosphere (the second heat treatment step), or a cleaning step conducted between the steps to form recess (pit) on the surface, whereby the surface roughness is deteriorated. Therefore, the substrate oxygen concentration is within a range of $10 \times 10^{17}/cm^3$ to $18 \times 10^{17}/cm^3$. Preferably, it is within a range of $12 \times 10^{17}/cm^3$ to $15 \times 10^{17}/cm^3$.

Moreover, the substrate oxygen concentration of the silicon wafer for active layer is required to be $10 \times 10^{17}/cm^3$ to $18 \times 10^{17}/cm^3$ as mentioned above, so that a crystal with a desired oxygen concentration can be obtained by adjusting a rotation of a quartz crucible in the pulling of a silicon single crystal, a rotation of a crystal, a strength of a magnetic field capable of controlling convection in a melt, and so on.

In the invention, when the silicon wafer for active layer having the above substrate oxygen concentration is obtained from a single crystal silicon ingot by slicing, it is required to conduct the slicing so as to have such a wafer face that an inclination angle $\theta$ with respect to a face perpendicular to a crystal orientation of the single crystal silicon ingot is within a range of $0°<\theta \leq 0.15°$. When $\theta$ exceeds $0.15°$, the surface roughness of the active layer in a bonded silicon wafer as a final product is deteriorated, so that $\theta$ is not more than $0.15°$. Specifically, when a surface planarization is conducted by a heat treatment in a reducing atmosphere capable of uniformly keeping the thickness of the active layer after the removal of the oxygen ion implanted layer, if $\theta$ exceeds $0.15°$, the planarizing effect by the heat treatment is considerably deteriorated to render the surface roughness into RMS>0.2 nm (measuring range of 30×30 μm), and hence it is difficult to measure defects having a size of not more than 0.10 μm in the measurement with a laser surface detector for measuring defects and dusts on the wafer surface. Also, when the surface planarization is conducted by the polishing effective in reducing the surface roughness, a polish margin of not less than 0.1 μm is required for RMS<0.2 nm, and hence the uniformity of the active layer is largely deteriorated due to poor polishing accuracy. Therefore, $\theta$ is not more than $0.15°$. However, when $\theta$ is $0°$, the blue haze becomes a problem in the DSB wafer. Thus, the inclination angle $\theta$ is within a range of $0°<\theta \leq 0.15°$. Preferably, it is within a range of $0°<\theta \leq 0.10°$.

Moreover, as a slicing method are mentioned a method using a diamond blade, a method using a wire saw and the like. When the diameter of the silicon wafer is not less than 200 mm, a method using a multi wire saw (a method of slicing 100 or more wafers at once) is preferable because the warping of the wafer after the slicing is small and the process cost is reduced by reducing the slice margin.

As a crystal face of the silicon wafer for active layer, a (100) face or (110) face is generally a wafer face, so that the crystal orientation of the silicon single crystal ingot to be sliced is <100> orientation or <110> orientation. However, it is not limited thereto. For example, a (111) face may be the crystal face of the silicon wafer for active layer.

Oxygen ions are implanted according to a usual manner from the one-side face of the thus obtained wafer for active layer to form an oxygen ion implanted layer at a given depth position from the one-side face of the silicon wafer for active layer. It is preferable that oxygen ions are implanted under such a condition that the given depth position is within a range of 300 to 600 nm.

(2) Step of Forming Silicon Wafer Composite

A silicon wafer composite is formed by bonding the one-side face of the silicon wafer for active layer to an arbitrary face of a silicon wafer for support indirectly through an insulating layer or directly. Concretely, the silicon wafer for support is provided with an insulating layer (e.g. $SiO_2$ layer) and is indirectly bonded to the silicon wafer for active layer through the insulating layer to form a silicon wafer composite. This silicon wafer composite is treated through subsequent steps to form an SOI wafer as a final product. Alternatively, a silicon wafer composite may be formed by directly bonding the silicon wafer for active layer and the silicon wafer for support having no insulating layer. This silicon wafer composite is treated through subsequent steps to form a DSB wafer as a final product.

(3) First Heat Treatment Step

The silicon wafer composite is subjected to a heat treatment to strengthen the bonding and to convert the oxygen ion implanted layer into an inner $SiO_2$ layer as an etching/polishing stop layer. The heat treating conditions are preferable to be a temperature of 1000 to 1300° C. and a holding time of 1 to 10 hours. An atmosphere of the heat treatment is not particularly limited, but it is more preferable that the heat treatment is conducted in an oxygen atmosphere to form an $SiO_2$ film with a thickness of not less than 200 nm as a protective film on the surface of the silicon wafer composite in order to prevent the silicon wafer composite after the first heat treatment step from getting a scar on a back face thereof or a surface roughening by the etching in the next step of exposing the inner $SiO_2$ layer.

Moreover, in order to promote the formation of an etching/polishing stop layer, a preliminary heat treatment step of heat-treating the silicon wafer for active layer implanted with oxygen ions at a temperature region of 1000 to 1200° C. for not less than 1 hour before the bonding may be added in addition to the first heat treatment step. By the first heat treatment step and the preliminary heat treatment step is formed an inner $SiO_2$ layer inside the silicon wafer for active layer. The form of the inner $SiO_2$ layer is a layer containing $SiO_2$ particles or a continuous $SiO_2$ layer. The thickness of the inner $SiO_2$ layer varies depending on oxygen ion implanting dose, but is preferably within a range of 100 to 3000 nm.

(4) Step of Exposing Inner $SiO_2$ Layer

The silicon wafer composite having strengthened bonding and provided with the inner $SiO_2$ layer is subjected to grinding, polishing and/or etching from a front face side of the wafer for active layer to expose the inner $SiO_2$ layer onto the surface of the silicon wafer composite. At first, the grinding is conducted. In this case, it is preferable that the grinding is conducted just before the oxygen ion implanted layer for shortening the next polishing time. However, a residual silicon thickness is preferable to be 3 to 10 μm considering the accuracy of the grinding apparatus and the damage depth by grinding (approximately 2 μm).

Subsequently, the polishing and/or etching are conducted. In this case, the inner $SiO_2$ layer serves as an etching/polishing stop layer. The polishing can be conducted by using a solution having a large polishing rate ratio of Si and $SiO_2$, for example, a KOH solution capable of polishing Si only. The polishing rate ratio is preferably larger, which is not less than 10, and more preferably not less than 100. However, when $SiO_2$ particles are discontinuously existent in Si as a stop layer, the etching solution soaks through $SiO_2$ particles, so that the stop layer is preferably a continuous $SiO_2$ layer when the etching is applied.

(5) Step of Removing Inner $SiO_2$ Layer

The removal of the exposed inner $SiO_2$ layer can be conducted, for example, by an HF treatment. In the HF treatment, the exposed inner $SiO_2$ layer can be completely removed, for example, by using a batch-type cleaning apparatus and immersing the silicon wafer composite having the exposed inner $SiO_2$ layer in a diluted 1% HF solution for 5 minutes. When the inner $SiO_2$ layer is in a discontinuous form, a heat treatment in an oxidizing atmosphere is conducted to change the inner $SiO_2$ layer of the discontinuous form into a continuous $SiO_2$ layer, which is then subjected to an HF treatment, whereby the inner $SiO_2$ layer can be completely removed.

(6) Planarization Step

The surface of the silicon wafer composite after the removal of the inner $SiO_2$ layer is subjected to the polishing, or the silicon wafer composite is subjected to a heat treatment in a reducing atmosphere to planarize the surface of the silicon wafer composite to thereby provide a bonded wafer as a final product.

In case of the surface planarization through the polishing, the flatness is improved as the polish margin becomes large. However, it is dependent on the accuracy of the polishing apparatus, so that the effect by the surface planarization through the polishing is not generally so high as compared to the planarization through the heat treatment. Therefore, the polishing margin is preferable to be less than 0.1 μm in order to ensure an in-plane uniformity of the active layer.

In case of the surface planarization through the heat treatment (second heat treatment step), the heat treating temperature is preferable to be a temperature sufficient to migrate silicon atoms to planarize the silicon wafer composite, i.e., not lower than 1000° C. On the other hand, when it exceeds 1200° C., a specific heat-treating furnace is required and also slip dislocation tends to be caused due to thermal stress. Therefore, the heat treating temperature is preferable to be within a range of 1000 to 1200° C. The heat treating time may be a time sufficient to migrate silicon to planarize the silicon wafer composite, which is within a range of 10 minutes to 10 hours.

The active layer thickness of a portion forming devices is determined depending on the characteristics required for the device, but it is critical in relation to an acceleration voltage of an oxygen ion implanting apparatus. In general, the acceleration voltage of a commercially available oxygen ion implanting apparatus is approximately 220 keV, so that the active layer thickness is approximately 500 nm in maximum.

Although the above is merely described with respect to one embodiment of the invention, various modifications may be made without departing from the scope of the appended claims.

EXAMPLE 1

A sample of the SOI structure is prepared through the following procedures.

(1) A silicon wafer having a substrate oxygen concentration of $15 \times 10^{17}/cm^3$ and a substrate resistance of 10 Ωcm is sliced so as to have such a wafer face that an inclination angle θ (compound angle) with respect to a face perpendicular to <100> orientation of a (100) p-type single crystal silicon ingot having a diameter of 300 mm and containing boron is 0°, 0.02°, 0.10°, 0.15°, 0.20°, 0.40° and 2.00°, and then oxygen ions are implanted from one-side face of the sliced silicon wafer to form an oxygen ion implanted layer to thereby provide a silicon wafer for active layer. Moreover, the oxygen ion implantation is a two-step implantation, and implantation conditions of each step are as follows:

First Step
Acceleration voltage: 200 keV, dose amount: $1 \times 10^{17}$ atoms/cm$^2$, silicon wafer temperature: 400° C.

Second Step
Acceleration voltage: 200 keV, dose amount: $5 \times 10^{15}$ atoms/cm$^2$, silicon wafer temperature: 40° C.

(2) A silicon wafer having a substrate oxygen concentration of $15 \times 10^{17}/cm^3$ and a substrate resistance of 20 Ωcm is sliced so as to have such a wafer face that an inclination angle θ (compound angle) with respect to a face perpendicular to <100> orientation of a (100) p-type single crystal silicon ingot having a diameter of 300 mm and containing boron is 0°, and then the sliced silicon wafer is subjected to a heat treatment in an oxygen atmosphere at 1000° C. for 5 hours to form a BOX layer having a thickness of 1500 Å to thereby provide a silicon wafer for support.

(3) A one-side face (oxygen ion implanting side) of the silicon wafer for active layer and an arbitrary face of the wafer for support are bonded to form a silicon wafer composite.

(4) As a first heat treatment step, the silicon wafer composite is subjected to a heat treatment in an oxygen atmosphere at 1200° C. for 1 hour to strengthen the bonding and form an inner SiO$_2$ layer as a polishing stop layer.

(5) The silicon wafer composite after the first heat treatment step is ground from the front face of the silicon wafer for active layer till a residual silicon thickness is about 10 μm. Further, polishing is conducted up to the inner SiO$_2$ layer with an alkaline polishing solution containing no abrasive grains to expose the inner SiO$_2$ layer.

(6) Subsequently, after the heat treatment in an oxidizing atmosphere at 850° C. for 5 hours, the exposed inner SiO$_2$ layer is removed by using an HF solution (concentration of 25%).

(7) As a second heat treatment step, the silicon wafer composite after the removal of the exposed inner SiO$_2$ layer is subjected to a heat treatment in an argon atmosphere at 1200° C. for 1 hour to planarize the surface to thereby provide a bonded silicon wafer.

Next, a sample of a DSB structure is prepared through the following procedures.

(1) A silicon wafer having a substrate oxygen concentration of $15 \times 10^{17}/cm^3$ and a substrate resistance of 10 Ωcm is sliced so as to have such a wafer face that an inclination angle θ (compound angle) with respect to a face perpendicular to <110> orientation of a (110) p-type single crystal silicon ingot having a diameter of 300 mm and containing boron is 0°, 0.02°, 0.10°, 0.15°, 0.20°, 0.40° and 2.00°, and then oxygen ions are implanted from one-side face of the sliced silicon wafer to form an oxygen ion implanted layer to thereby provide a silicon wafer for active layer. Moreover, the oxygen ion implantation is a two-step implantation, and implantation conditions of each step are as follows:

First Step
Acceleration voltage: 200 keV, dose amount: $1 \times 10^{17}$ atoms/cm$^2$, silicon wafer temperature: 400° C.

Second Step
Acceleration voltage: 200 keV, dose amount: $5 \times 10^{15}$ atoms/cm$^2$, silicon wafer temperature: 40° C.

(2) A silicon wafer having a substrate oxygen concentration of $15 \times 10^{17}/cm^3$ and a substrate resistance of 20 Ωcm is sliced so as to have such a wafer face that an inclination angle θ (compound angle) with respect to a face perpendicular to <100> orientation of a (100) p-type single crystal silicon ingot having a diameter of 300 mm and containing boron is 0°, and then the sliced silicon wafer is subjected to a heat treatment in an oxygen atmosphere at 1000° C. for 5 hours to form a BOX layer having a thickness of 1500 Å to thereby provide a silicon wafer for support.

The procedures (3) to (7) are conducted in the same manner as in the bonded silicon wafer of the SOI structure.

With respect to each of the thus obtained samples are evaluated the surface roughness and the generation status of blue haze.

(Surface Roughness)
The surface roughness of the active layer after the removal of the exposed inner SiO$_2$ layer is evaluated by an AFM.

(Generation Status of Blue Haze)
The presence or absence of the generation of blue haze is determined by visually observing the appearance under a spotlight.

The evaluation results are shown in Table 1.

TABLE 1

| Sample name | Structure | Wafer for active layer | | Surface roughness | |
| --- | --- | --- | --- | --- | --- |
| | | Inclination angle θ (°) | Substrate oxygen concentration ($\times 10^{17}/cm^3$) | RMS (30 μm × 30 μm) (nm) | Generation status of blue haze |
| Comparative Example 1 | SOI | 0 | 15 | 0.09 | Abnormal surface color |
| Invention Example 1 | SOI | 0.02 | 15 | 0.11 | Absence |
| Invention Example 2 | SOI | 0.10 | 15 | 0.12 | Absence |
| Invention Example 3 | SOI | 0.15 | 15 | 0.14 | Absence |
| Comparative Example 2 | SOI | 0.20 | 15 | 0.20 | Absence |

TABLE 1-continued

| Sample name | Structure | Wafer for active layer Inclination angle θ (°) | Substrate oxygen concentration (×10¹⁷/cm³) | Surface roughness RMS (30 μm × 30 μm) (nm) | Generation status of blue haze |
|---|---|---|---|---|---|
| Comparative Example 3 | SOI | 0.40 | 15 | 0.45 | Absence |
| Comparative Example 4 | SOI | 2.00 | 15 | 0.64 | Absence |
| Comparative Example 5 | DSB | 0 | 15 | 0.11 | Presence |
| Invention Example 4 | DSB | 0.02 | 15 | 0.11 | Absence |
| Invention Example 5 | DSB | 0.10 | 15 | 0.12 | Absence |
| Invention Example 6 | DSB | 0.15 | 15 | 0.14 | Absence |
| Comparative Example 6 | DSB | 0.20 | 15 | 0.22 | Absence |

As seen from Table 1, it is confirmed that Invention Examples 1 to 6 are excellent in the surface roughness as compared to Comparative Examples 2 to 4, and 6. It is also confirmed that there is no blue haze in Invention Examples 4 to 6 regardless of being the DSB wafers. However, Comparative Examples 1 and 5 having the inclination angle θ of 0° are excellent in the surface roughness, but an abnormal surface color is confirmed in Comparative Example 1 of the SOI wafer and the generation of blue haze is confirmed in Comparative Example 5 of the DSB wafer.

EXAMPLE 2

A sample is prepared in the same manner as in Example 1 except that the inclination angle θ in the slicing of the silicon wafer for active layer is 0.10° and the substrate oxygen concentration of the silicon wafer for active layer is changed into $10 \times 10^{17}$ to $20 \times 10^{17}/cm^3$, and then the surface roughness is evaluated in the same way as in Example 1. As to the sample of the SOI structure, the evaluation on defect density (evaluation of HF defect) for determining the influence of defects in the active layer on the surface roughness is conducted by immersing the sample in a 50% HF solution for 30 minutes to enlarge the defects and then observing with an optical microscope. As to the sample of DSB structure, the evaluation of HF defect is not conducted because a buried oxide film is not existent and the soaking of HF is not caused. The evaluation results are shown in Table 2.

TABLE 2

| Sample name | Structure | Silicon wafer for active layer Inclination angle θ (°) | Substrate oxygen concentration (×10¹⁷/cm³) | Surface roughness RMS (30 μm × 30 μm) (nm) | HF defect (1/cm²) |
|---|---|---|---|---|---|
| Comparative Example 7 | SOI | 0.10 | 20 | 0.45 | >1.0 |
| Comparative Example 8 | SOI | 0.10 | 19 | 0.23 | >1.0 |
| Invention Example 7 | SOI | 0.10 | 18 | 0.13 | 0.2 |
| Invention Example 8 | SOI | 0.10 | 13 | 0.12 | 0.1 |
| Invention Example 9 | SOI | 0.10 | 11 | 0.14 | 0.1 |
| Invention Example 10 | SOI | 0.10 | 10 | 0.12 | 0.1 |
| Comparative Example 9 | DSB | 0.10 | 20 | 0.37 | |
| Comparative Example 10 | DSB | 0.10 | 19 | 0.21 | |
| Invention Example 11 | DSB | 0.10 | 18 | 0.14 | |
| Invention Example 12 | DSB | 0.10 | 13 | 0.12 | |
| Invention Example 13 | DSB | 0.10 | 11 | 0.13 | |
| Invention Example 14 | DSB | 0.10 | 10 | 0.12 | |

As seen from Table 2, it is confirmed that Invention Examples 7 to 14 are excellent in the surface roughness as compared to Comparative Examples 7 to 10. Also, it is confirmed that there are few HF defects in Invention Examples 7 to 10.

EXAMPLE 3

A sample of the SOI structure is prepared in the same manner as in Example 1 except that the inclination angle θ in the slicing of the silicon wafer for active layer is 0.10° and the heat treating temperatures at the first heat treatment step are 950, 1200 and 1320° C. and the heat treating temperatures at the second heat treatment step are 950, 1150 and 1250° C. and the heat treating time at the second heat treatment step is 1 hour or 0.5 hour, and then the surface roughness is evaluated in the same way as in Example 1 and the active layer thickness is measured by an ellipsometry method to evaluate the uniformity based on the smallest value and the largest value. Moreover, in Invention Examples 22 and 23, a polishing method is applied instead of the heat treatment as the planarization treatment, wherein the polishing margin is 0.05 μm and 0.10 μm, respectively. The evaluation results are shown in Table 3.

As seen from Table 3, it is confirmed that Invention Examples 15 to 18 are further excellent in the surface roughness as compared to Invention Examples 19 and 20. It is also confirmed that Invention Examples 22 and 23 conducting the planarization through the polishing are excellent in the surface roughness but poor in the uniformity of active layer thickness as compared to Invention Examples 15 to 21 conducting the planarization through the heat treatment. It is further confirmed that in Invention Example 22 using a small polishing margin, the surface roughness can be improved without largely deteriorating the uniformity of active layer thickness.

EXAMPLE 4

A sample of the SOI structure is prepared in the same manner as in Example 1 except that the inclination angle θ in the slicing of the silicon wafer for active layer is 0.10° and the acceleration voltage in the oxygen ion implantation is changed within a range of 80 to 220 keV, and then the surface roughness is evaluated in the same way as in Example 1 and the evaluation of defect density (evaluation of HF defect) is evaluated in the same way as in Example 2. In this example, a depth position of the oxygen ion implanted layer in the silicon wafer for active layer from the oxygen ion implanting side is measured with an SIMS analyzing apparatus after the oxygen ion implantation. The evaluation results are shown in Table 4.

TABLE 3

| | | Silicon wafer for active layer | | First heat treatment step | Second heat treatment step | | Polishing | Surface roughness | Uniformity of active layer |
| --- | --- | --- | --- | --- | --- | --- | --- | --- | --- |
| Sample name | Structure | Inclination angle θ (°) | Substrate oxygen concentration (×10$^{17}$/cm$^3$) | Temperature (° C.) | Temperature (° C.) | Time (hour) | Polishing margin (nm) | RMS (30 μm × 30 μm) (nm) | thickness (nm) |
| Invention Example 15 | SOI | 0.10 | 15 | 1200 | 1150 | 1 | — | 0.13 | 7 |
| Invention Example 16 | SOI | 0.10 | 15 | 950 | 1150 | 1 | — | 0.13 | 8 |
| Invention Example 17 | SOI | 0.10 | 15 | 1320 | 1150 | 1 | — | 0.12 | 8 |
| Invention Example 18 | SOI | 0.10 | 15 | 1200 | 1200 | 1 | — | 0.11 | 7 |
| Invention Example 19 | SOI | 0.10 | 15 | 1200 | 950 | 1 | — | 0.19 | 7 |
| Invention Example 20 | SOI | 0.10 | 15 | 1200 | 1250 | 1 | — | 1.1 Slip | 8 |
| Invention Example 21 | SOI | 0.10 | 15 | 1200 | 1100 | 0.5 | — | 0.15 | 7 |
| Invention Example 22 | SOI | 0.10 | 15 | 1200 | — | — | 0.05 | 0.10 | 9 |
| Invention Example 23 | SOI | 0.10 | 15 | 1200 | — | — | 0.10 | 0.08 | 20 |

TABLE 4

| | | Silicon wafer for active layer | | Acceleration voltage in oxygen ion implantation (KeV) | Depth of oxygen ion implanted layer (nm) | Surface roughness RMS (30 μm × 30 μm) (nm) | HF defect (1/cm$^2$) |
| --- | --- | --- | --- | --- | --- | --- | --- |
| Sample name | Structure | Inclination angle θ (°) | Substrate oxygen concentration (×10$^{17}$/cm$^3$) | | | | |
| Invention Example 24 | SOI | 0.10 | 13 | 80 | 200 | 0.14 | 0.3 |
| Invention Example 25 | SOI | 0.10 | 13 | 150 | 350 | 0.13 | 0.1 |
| Invention Example 26 | SOI | 0.10 | 13 | 220 | 500 | 0.12 | 0.05 |

As seen from Table 4, it is confirmed that Invention Examples 25 and 26 are further excellent in the surface roughness as compared to Invention Example 24. This is presumed that by forming the oxygen ion implanted layer at a desired depth position is formed the inner $SiO_2$ layer formed after the first heat treatment at an appropriate depth position as a polishing stop layer, which stops the polishing more effectively to improve the surface roughness. In Invention Example 24, it is guessed that the oxygen ion implanted layer is shallow and the damage by the oxygen ion implantation remains in the active layer, and hence the surface roughness and the HF defects increase.

According to the invention, it is possible to produce a bonded silicon wafer (e.g. SOI wafer and DSB wafer) in which the surface roughness of an active layer is small. According to the invention, it is also possible to produce a DSB wafer without a blue haze.

What is claimed is:

1. A method for producing a bonded silicon wafer comprising implanting oxygen ions from one-side face of a silicon wafer for active layer with a substrate oxygen concentration of $10 \times 10^{17}/cm^3$ to $18 \times 10^{17}/cm^3$ (old ASTM conversion) sliced so as to have such a wafer face that an inclination angle θ (compound angle) with respect to a face perpendicular to <100> orientation or <110> orientation of a silicon single crystal ingot is $0° < θ \leqq 0.15°$ to form an oxygen ion implanted layer at a given depth position from the one-side face of the silicon wafer for active layer;

bonding the one-side face of the silicon wafer for active layer to one-side face of a silicon wafer for support to form a silicon wafer composite;

heat-treating (a first heat treatment step) the silicon wafer composite to strengthen the bonding and to convert the oxygen ion implanted layer into an inner $SiO_2$ layer;

exposing the inner $SiO_2$ layer from other face of the silicon wafer for active layer in the silicon wafer composite;

removing the inner $SiO_2$ layer; and planarizing and polishing a surface of the silicon wafer composite after the removal of the inner $SiO_2$ layer or subjecting the silicon wafer composite to a heat treatment in a reducing atmosphere (a second heat treatment step) to improve a flatness of the silicon wafer composite.

2. A method for producing a bonded silicon wafer according to claim 1, wherein the silicon wafer for active layer is a p-type silicon wafer.

3. A method for producing a bonded silicon wafer according to claim 2, wherein the p-type silicon wafer contains boron as an electrically conductive component.

4. A method for producing a bonded silicon wafer according to claim 1, wherein the given depth position of the oxygen ion implantation is a depth position of 300 to 600 nm from the one-side face of the silicon wafer for active layer.

5. A method for producing a bonded silicon wafer according to claim 1, wherein the silicon wafer composite is formed by indirectly bonding the one-side face of the silicon wafer for active layer to the silicon wafer for support through an insulating layer previously formed on the one-side face of the silicon wafer for support.

6. A method for producing a bonded silicon wafer according to claim 1, wherein the silicon wafer composite is formed by directly bonding the one-side face of the silicon wafer for active layer to the silicon wafer for support without an insulating layer.

7. A method for producing a bonded silicon wafer according to claim 1, wherein the first heat treatment step is conducted within a temperature region of 1000° C. to 1300° C.

8. A method for producing a bonded silicon wafer according to claim 1, wherein the second heat treatment step is conducted within a temperature region of 1000° C. to 1200° C.

* * * * *